(12) United States Patent
Vimercati et al.

(10) Patent No.: US 7,023,738 B2
(45) Date of Patent: Apr. 4, 2006

(54) FULL-SWING WORDLINE DRIVING CIRCUIT

(75) Inventors: Daniele Vimercati, Carate Brianza (IT); Stefan Schippers, Perschiera Del Garda (IT); Graziano Mirichigni, Pietracamela (IT); Corrado Villa, Sovico (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/835,538

(22) Filed: Apr. 29, 2004

(65) Prior Publication Data

US 2005/0013170 A1  Jan. 20, 2005

(30) Foreign Application Priority Data

Apr. 30, 2003  (EP)  .................................. 03425264

(51) Int. Cl.
*G11C 16/06* (2006.01)

(52) U.S. Cl. .............................. 365/185.23; 365/198.11

(58) Field of Classification Search ........... 365/185.23, 365/185.29, 185.33, 230.06, 189.09
See application file for complete search history.

(56) References Cited

U.S. PATENT DOCUMENTS

| 5,959,890 A | 9/1999 | Yamamoto et al. ..... 365/185.23 |
| 6,021,083 A | 2/2000 | Shiau et al. ........... 365/230.01 |
| 6,665,229 B1 * | 12/2003 | Lee et al. .............. 365/230.06 |

* cited by examiner

*Primary Examiner*—Thong Q. Le
(74) *Attorney, Agent, or Firm*—Lisa K. Jorgenson; Dennis M. de Guzman; Seed IP Law Group PLLC

(57) ABSTRACT

A circuit is proposed for driving a memory line controlling at least one memory cell of a non-volatile memory device, the circuit being responsive to a first and a second selection signals, each one suitable to assume a first logic value or a second logic value, wherein the circuit includes a first level shifter for converting the first selection signal into a first operative signal and a second level shifter for converting the second selection signal into a second operative signal, each level shifter including first shifting means for shifting one of the logic values of the corresponding selection signal to a first bias voltage, and a selector for applying the first operative signal or a second bias voltage to the memory line according to the second operative signal; in the circuit of the invention each level shifter further includes second shifting means for shifting another of the logic values of the corresponding selection signal to the second bias voltage.

14 Claims, 4 Drawing Sheets

FULL-SWING WORDLINE DRIVING CIRCUIT

BACKGROUND OF THE INVENTION

1. Field of the Invention

The present invention relates to a driving circuit for a non-volatile memory device.

2. Description of the Related Art

Non-volatile memory devices (for example, flash memories) are commonly used in several applications when data must be preserved even if a power supply is off (such as in Personal Computers, cellular phones, digital still cameras, or automotive devices).

The flash memory is a particular type of $E^2PROM$, wherein each memory cell consists of a single transistor (typically a floating gate MOS transistor). The cells of the flash memory are programmed by injecting electric charge into their floating gates; conversely, the cells are erased by discharging their floating gates. The electric charge in the floating gate of each cell modifies its threshold voltage, so as to define different logic values.

Generally, the flash memory includes one or more sectors, each one consisting of a matrix of memory cells organized into a plurality of rows and columns. The memory cells of each row are associated with a wordline, whereas the memory cells of each column are associated with a bitline.

Operation on the flash memory requires the application of different (positive or negative) bias voltages to the wordline. For this purpose, logic signals used to select a wordline must be translated into the desired bias voltage. A circuit known in the art for selecting and driving a wordline consists of two lever shifters and a selector. Each level shifter (supplied between a positive bias voltage and a reference voltage) converts a corresponding logic signal into an operative signal; when the logic signal has the value 1, the level shifter boosts up the operative signal to the positive bias voltage. The selector consists of a complementary half-bridge, which is supplied between one of the operative signals and a negative bias voltage. The selector transfers the operative signal or the negative bias voltage to the corresponding wordline, according to the other operative signal.

An intrinsic limitation of the driving circuit described above is that it does not support a negative bias voltage lower than a typical threshold voltage of the transistors used to implement the selector (such as −1.2 V). This is a drawback because the threshold voltage of memory cells that have been over-erased (depleted cells) could be lower than the negative bias voltage. When the voltage applied to the depleted cells is higher than their threshold voltage, the depleted cells are conductive, even if they are not selected. A resulting leakage current flowing in the corresponding bitlines could bring about a malfunctioning of the flash memory.

BRIEF SUMMARY OF THE INVENTION

Briefly, the present invention provides a circuit for driving a memory line controlling at least one memory cell of a non-volatile memory device, the circuit being responsive to a first and a second selection signals each one suitable to assume a first logic value or a second logic value, wherein the circuit includes: a first level shifter for converting the first selection signal into a first operative signal and a second level shifter for converting the second selection signal into a second operative signal, each level shifter including first shifting means for shifting one of the logic values of the corresponding selection signal to a first bias voltage, and a selector for applying the first operative signal or a second bias voltage to the memory line according to the second operative signal, wherein each level shifter further includes second shifting means for shifting another of the logic values of the corresponding selection signal to the second bias voltage.

Moreover, the present invention provides a memory device including that driving circuit. A corresponding driving method and a method of erasing a flash memory are also encompassed.

BRIEF DESCRIPTION OF THE SEVERAL VIEWS OF THE DRAWINGS

Further features and the advantages of the solution according to the present invention will be made clear by the following description of a preferred embodiment thereof, given purely by way of a non-restrictive indication, with reference to the attached figures, in which.

DETAILED DESCRIPTION OF THE INVENTION

Figure 1:
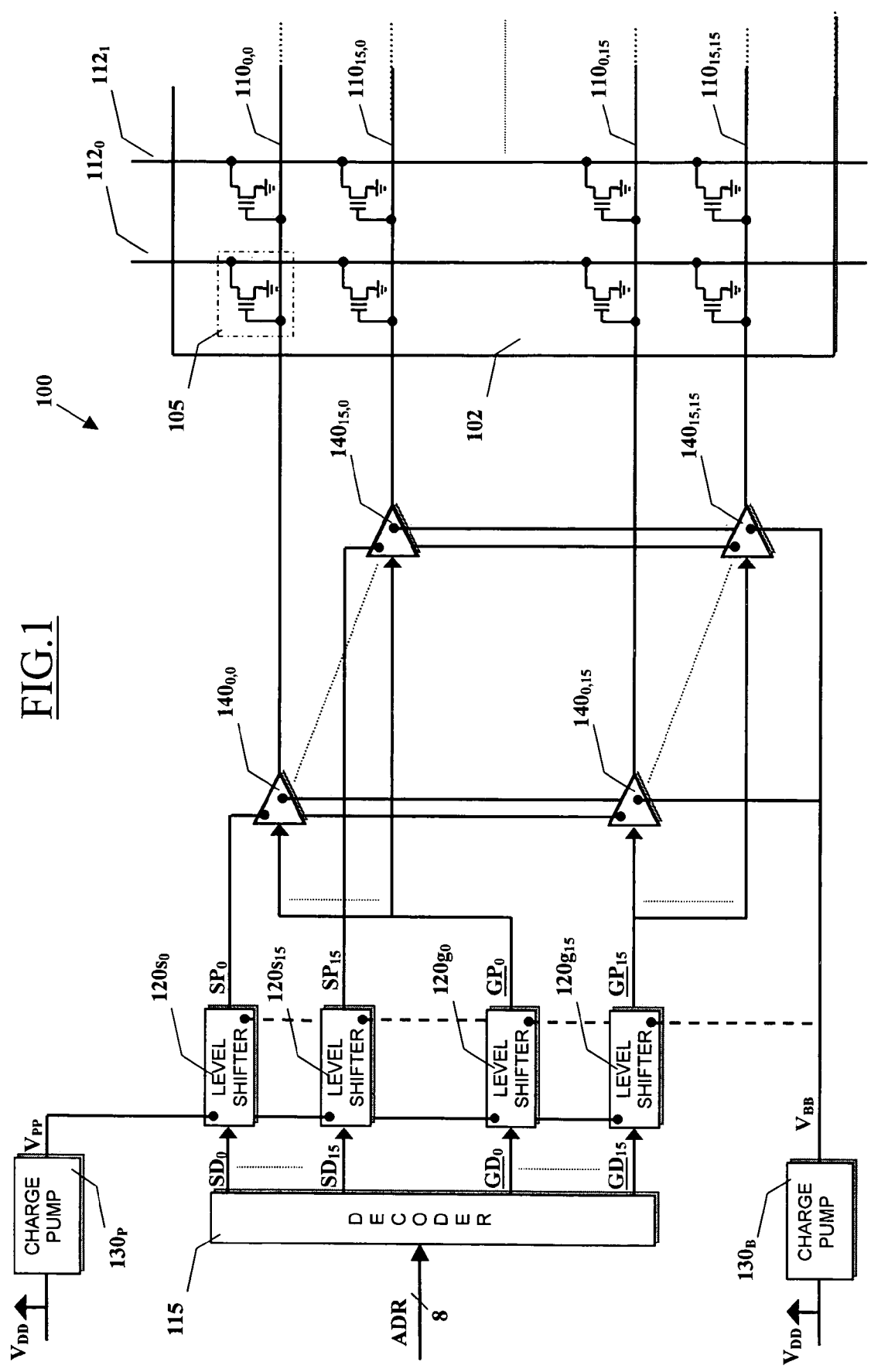
FIG. 1 is a schematic block diagram of a portion of a flash memory in which the solution of the invention is applicable.

With reference in particular to FIG. 1, a portion of a flash memory 100 is shown. The flash memory 100 is segmented into a plurality of sectors (only one shown in the figure); a generic sector 102 consists of a matrix of memory cells 105, which matrix is organized into a plurality of rows (for example, 256) and a plurality of columns (for example, 1024). The rows are logically organized in 16 sets (identified by an index i=0, . . . , 15); each set consists of 16 rows (identified by an index j=0, . . . , 15). The memory cells 105 of each row are controlled by a wordline 110$_{ij}$, whereas the memory cells 105 of each column are controlled by a bitline 112$_k$ (with k=0, . . . , 1023). Each memory cell 105 is implemented by a floating gate MOS transistor having the drain terminal connected to the corresponding bitline 112$_k$, the control gate terminal connected to the corresponding wordline 110$_{ij}$ and the source terminal connected to a reference terminal (providing a reference voltage or ground).

The flash memory 100 receives an address for selecting a word (for example, consisting of 16 bits); for this purpose, one wordline 110$_{ij}$ and 16 bitlines 112$_k$ are selected at the same time. A portion of the address, denoted with ADR (8 bits in the example at issue), identifies the selected wordline 110$_{ij}$. A decoder 115 translates the address ADR into a sequence of 16 selection signals $SD_i$ and 16 selection signals $\underline{GD_j}$. The selection signals $SD_i$, $\underline{GD_j}$ assume a logic value 0 (equal to the ground voltage) or a logic value 1 (equal to a power supply voltage $V_{DD}$ of the flash memory 100, such as 1.5 V with respect to ground). The selection signal $\underline{GD_j}$ is underlined to indicate that it assumes the logic value 0 when asserted and the logic value 1 when de-asserted (contrary to the selection signal $SD_i$). The selection signals $SD_i$ are provided to corresponding level shifters 120$s_i$, whereas the selection signals $\underline{GD_j}$ are provided to corresponding level shifters 120$g_j$. The level shifters 120$s_i$, 120$g_j$ translate the selection signals $SD_i$, $\underline{GD_j}$ into corresponding signals $SP_i$, $\underline{GP_j}$ (as described in the following).

Two charge pumps $130_P$, $130_B$ receive the supply voltage $V_{DD}$. The charge pump $130_P$ provides a positive bootstrapped voltage $V_{PP}$ (for example, up to 9 V) to the level shifters $120s_i$, $120g_j$; the charge pump $130_B$ provides a negative bootstrapped voltage $V_{BB}$ (for example, down to −9 V) to the level shifters $120s_i$, $120g_j$ (when the flash memory 100 is implemented according to an embodiment of the invention). The voltages $V_{PP}$ and $V_{BB}$ are used to bias the wordlines $110_{ij}$; the positive bias voltage $V_{PP}$ and the negative bias voltage $V_{BB}$ are suitable for executing the operations, for example, of read, program and erase the flash memory 100.

The flash memory 100 further includes 256 selectors $140_{ij}$, each one for a corresponding wordline $110_{ij}$. Each selector $140_{ij}$ is supplied by the corresponding signal $SP_i$ and the negative bias voltage $V_{BB}$; in detail, each supply signal $SP_i$ is provided to one selector $140_{ij}$ in every set. All the selectors $140_{ij}$ of each set are controlled by the corresponding signal $\underline{GP}_j$. For example, the level shifter $120s_0$ is connected to the selectors $140_{0,0}, \ldots, 140_{0,15}$, the level shifter $120g_0$ is connected to the selectors $140_{0,0}, \ldots, 140_{15,0}$ and so on. Each selector $140_{ij}$ directly drives the associated wordline $110_{ij}$, applying the supply signal $SP_i$ or the negative bias voltage $V_{BB}$ according to the control signal $\underline{GP}_j$.

The address ADR identifies a desired wordline $110_{ij}$. In response thereto, the decoder 115 asserts a single selection signal $SD_i$ (1) and a single selection signal $\underline{GD}_j$ (0). As a consequence, only one selector $140_{ij}$ (associated with the selected wordline $110_{ij}$) receives the signals $SP_i$, $\underline{GP}_j$ corresponding to the selection signals $SD_i$, $\underline{GD}_j$ that are both asserted. In this way, the supply signal $SP_i$ (equal to the positive bias voltage $V_{PP}$) is applied to the selected wordline $110_{ij}$, whereas the negative bias voltage $V_{BB}$ is applied to all the other wordlines. The described structure allows the reduction of the wires required to select the wordline $110_{ij}$ (16+16=32 instead of 256).

However, the concepts of the present invention are also applicable when the flash memory has another structure, or when each wordline controls a different number of memory cells (down to a single one). Similar considerations apply if the decoder translates the wordline address into an alternative sequence of selection signals, or if the flash memory includes a single sector. Alternatively, the bias voltages for executing the desired operations on the flash memory are provided by external devices, and the like.

Figure 2:
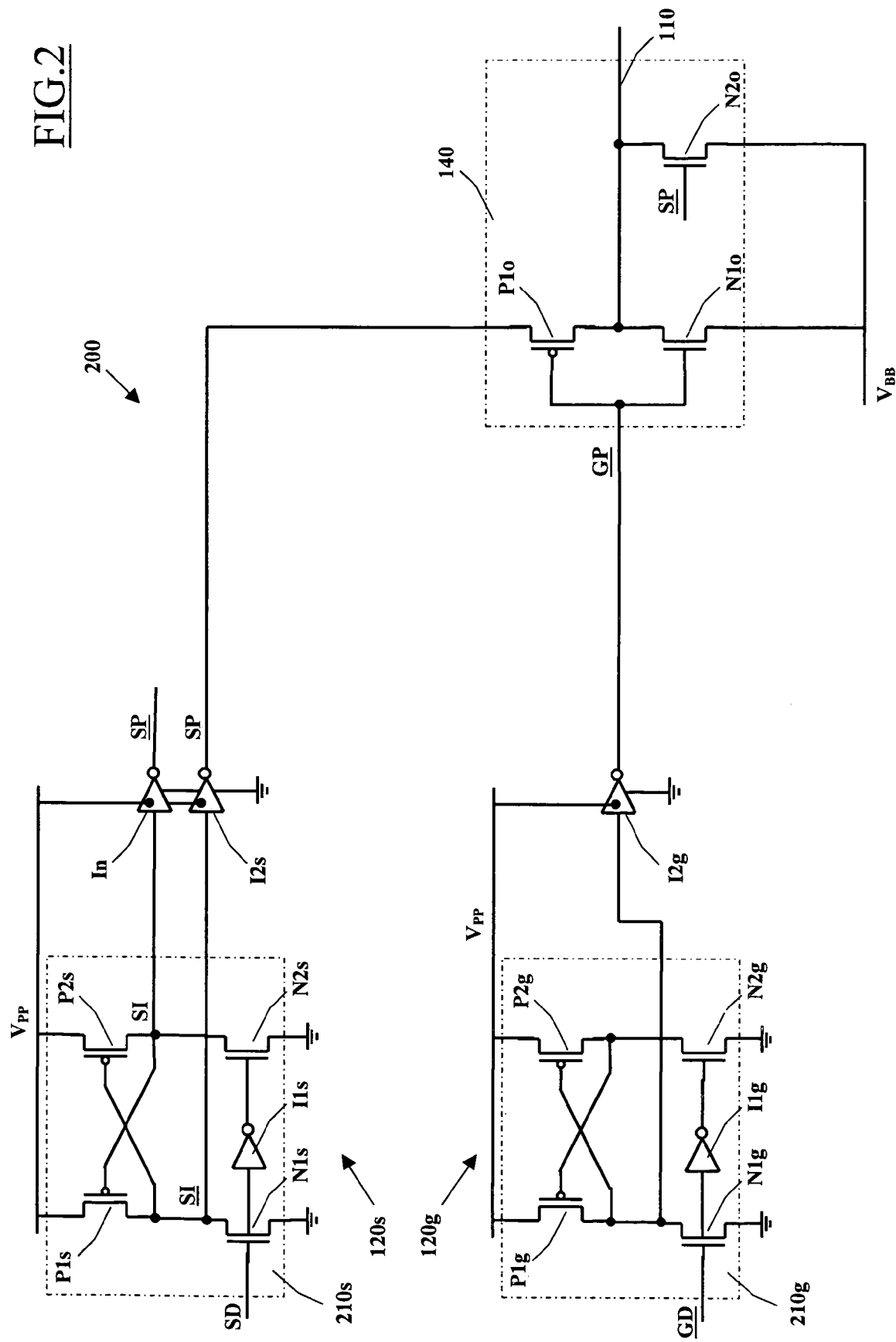
FIG. 2 shows a circuit known in the art for driving a wordline of the flash memory.

Considering now FIG. 2, a circuit 200 known in the art for driving a generic wordline 110 of the flash memory is shown. The circuit 200 is implemented by one level shifter 120s and one level shifter 120g (that receive the selection signals SD and $\underline{GD}$ and provide the signals SP and $\underline{GP}$, respectively) and by a selector 140 (from now on, the indexes i, j are omitted for the sake of simplicity).

The block 120s is a positive level shifter (supplied between the positive bias voltage $V_{PP}$ and the ground voltage), that boosts up the logic value 1 ($V_{DD}$) of the selection signal SD to the positive bias voltage $V_{PP}$. The level shifter 120s is implemented by a differential circuit 210s, which consists of two symmetric legs. In detail, the selection signal SD is applied to the gate terminal of an n-MOS transistor N1s; the selection signal SD is also applied to the gate terminal of a further n-MOS transistor N2s through an inverter I1s. The inverter I1s is supplied between the voltage $V_{DD}$ and the ground voltage. The source terminals of the transistors N1s and N2s are connected to the ground terminal; the drain terminals of the transistors N1s and N2s are connected to the drain terminals of two cross-coupled p-MOS transistors P1s and P2s, respectively.

The transistors P1s, P2s have the source terminals supplied by the positive bias voltage $V_{pp}$. The transistor P1s has the gate terminal connected to the drain terminal of the transistor P2s, whereas the transistor P2s has the gate terminal connected to the drain terminal of the transistor P1s. The voltage at the drain terminal of the transistor N2s defines an intermediate signal SI; the voltage at the drain terminal of the transistor N1s defines a further intermediate signal $\underline{SI}$ (opposite to the signal SI).

Two inverters I2s and In (operating as buffers) receive the intermediate signal $\underline{SI}$ from the leg N1s, P1s and the intermediate signal SI from the leg N2s, P2s, respectively. The inverters I2s and In, supplied between the positive bias voltage $V_{PP}$ and the ground voltage, provide the supply signal SP and a control signal $\underline{SP}$ (opposite to the signal SP).

The level shifter 120g has the same structure of the level shifter 120s: its elements are indicated substituting the suffix 'g' for the suffix 's'. Particularly, the block 120g is a positive level shifter that provides the control signal $\underline{GP}$. The control signal $\underline{GP}$ assumes the value of the positive bias voltage $V_{PP}$ or of the ground voltage.

The selector 140 is implemented by a complementary half-bridge consisting of a p-MOS transistor P1o and an n-MOS transistor N1o. The transistors P1o, N1o have the gate terminals connected together for receiving the control signal $\underline{GP}$; the source terminal of the transistor P1o is exposed to the supply signal SP, whereas the source terminal of the transistor N1o is exposed to the negative bias voltage $V_{BB}$. The drain terminal of the transistor P1o and the drain terminal of the transistor N1o are connected together to the wordline 110. An additional n-MOS transistor N2o receives the control signal $\underline{SP}$ at its gate terminal; the transistor N2o has the drain terminal connected to the wordline 110. The source terminal of the transistor N2o receives the negative bias voltage $V_{BB}$.

Depending on the value of the selection signal SD, one leg (N1s, P1s or N2s, P2s) of the differential circuit 210s will exhibit a low-impedance path and the other leg will exhibit a high-impedance path.

For example, when the selection signal SD is equal to the supply voltage $V_{DD}$ (logic value 1), the transistor N1s turns on and the transistor N2s turns off. Therefore, the drain terminal of the transistor N1s will be pulled down to the ground voltage. When this occurs, the transistor P2s turns on and pulls up the drain terminal of the transistor N2s to the positive bias voltage $V_{PP}$. This causes the transistor P1s to turns off (so that the circuit has no d.c. power dissipation, once finished its transition and settled). As a consequence, the intermediate signal $\underline{SI}$ will be equal to the ground voltage and the supply signal SP will be equal to the positive bias voltage $V_{PP}$ (with SI=$V_{PP}$ and $\underline{SP}$=0 at the same time). Conversely, when the selection signal SD is equal to the ground voltage (logic value 0) the drain terminal of the transistor N2s is pulled down to the ground voltage and the drain terminal of the transistor N1s is pulled up to the positive bias voltage $V_{PP}$ (so that SP=0 and $\underline{SP}$=$V_{PP}$). The level shifter 120g works in an analog way depending on the value of the selection signal GD.

Therefore, the supply signal SP and the control signal $\underline{GP}$ are equal to the positive bias voltage $V_{PP}$ (with $\underline{SP}$=0) when the selection signals SD and $\underline{GD}$ are at the logic value 1; the signals SP and $\underline{GP}$ are equal to the ground voltage (with $\underline{SP}$=$V_{PP}$) when the selection signals SD and $\underline{GD}$ are at the logic value 0.

When the wordline 110 is selected, both the selection signals GD and SD are asserted (GD=0, SD=1); in this case, the control signal GP is equal to the ground voltage and the supply signal SP is equal to the positive bias voltage $V_{PP}$. Therefore, the transistor N1o turns off and the transistor P1o turns on, so as to pull up the wordline 110 to the positive bias voltage $V_{PP}$. At the same time, the control signal SP is equal to the ground voltage; therefore, the transistor N1o turns off.

Conversely, when the selection signal GD is asserted, but the selection signal SD is de-asserted (GD=0, SD=0), the control signal GP and the supply signal SP are both equal to the ground voltage. The transistors N1o and P1o turn off and their drain terminals will be floating; however, the control signal SP is equal to the positive bias voltage $V_{PP}$; therefore, the transistor N2o turns on and pulls down the wordline 110 to the negative bias voltage $V_{BB}$.

When the selection signal GD is de-asserted, the control signal GP is equal to the positive bias voltage $V_{PP}$; therefore, for every value of the supply signal SP the transistor P1o turns off and the transistor N1o turns on, so as to pull down the wordline 110 to the negative bias voltage $V_{BB}$.

The lowest voltage reached by the gate terminals of the transistors N1o and N2o is the ground voltage. Therefore, the circuit 200 has the intrinsic limitation that the selector 140 cannot work when the negative bias voltage $V_{BB}$ reaches a value below a typical threshold voltage (such as −1.2 V with respect to ground) of the n-MOS transistors N1o, N2o.

Figure 3:
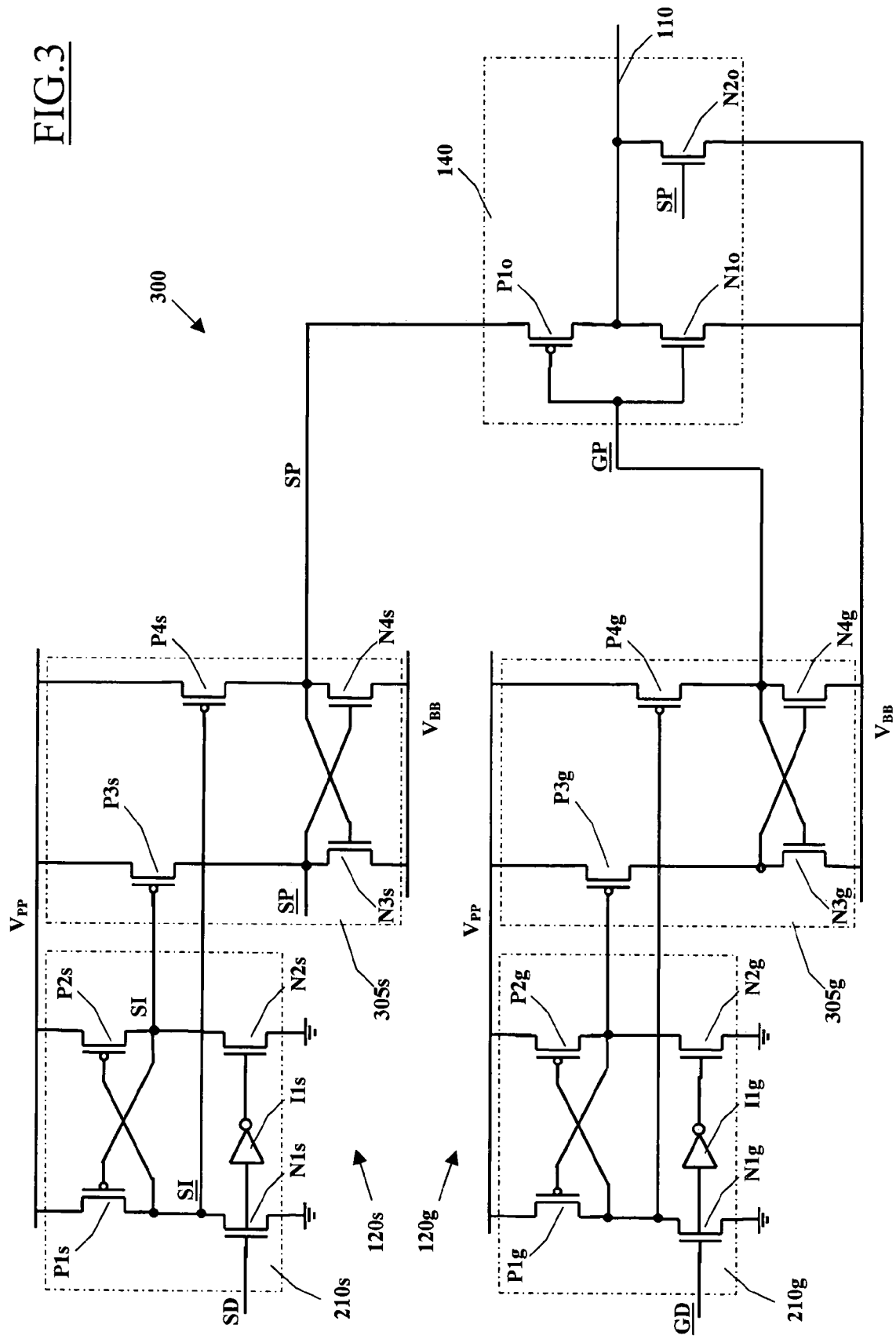
FIG. 3 illustrates an embodiment of the circuit for driving the wordline according to the present invention.

Referring now to FIG. 3, a circuit 300 for driving a wordline 110 according to an embodiment of the present invention is shown (the elements corresponding to the ones in the FIG. 2 are denoted with the same references, and their explanation is omitted for the sake of simplicity). The level shifters 120s, 120g are now implemented by two cascade connected stages. Considering in particular the level shifter 120s, the first stage is the same differential circuit 210s described previously. The second stage 305s is a further differential circuit, which operates as a negative level shifter; the second stage 305s converts the intermediate signals SI, SI into the signals SP, SP.

In detail, the first stage 210s applies the intermediate signal SI to the gate terminal of a p-MOS transistor P3s and the intermediate signal SI to the gate terminal of a p-MOS transistor P4s. The source terminals of the transistors P3s and P4s receive the positive bias voltage $V_{PP}$. The drain terminals of the transistors P3s and P4s are connected to the drain terminals of two cross-coupled n-MOS transistors N3s and N4s, respectively. The gate terminal of the transistor N3s is connected to the drain terminal of the transistor N4s and the gate terminal of the transistor N4s is connected to the drain terminal of the transistor N3s. The source terminals of the transistors N3s, N4s receive the negative bias voltage $V_{BB}$.

The level shifter 305g has the same structure of the level shifter 305s; its elements are indicated substituting the suffix 'g' for the suffix 's'.

The drain terminals of the transistors P4s, P3s and P4g provide the supply signal SP, the control signal SP and the control signal GP, respectively.

The negative level shifters 305s, 305g in the embodiment of FIG. 3 do not introduce any substantial time delay, because they substitute the buffers I2s, I2g and In (in the known circuit shown in FIG. 2) used to connect the positive level shifters 210s, 210g to the selector 140.

When the selection signal SD is at the logic value 1, the intermediate signal SI is equal to the positive bias voltage $V_{PP}$. In the second stage 305s the transistor P3s turns off; the transistor P4s turns on and pulls up the supply signal SP to the positive bias voltage $V_{PP}$; the transistor N3s turns on and pulls down the control signal SP to the negative bias voltage $V_{BB}$. Likewise, when the selection signal GD is at the logic value 1, the control signal GP is equal to the positive bias voltage $V_{PP}$.

When the selection signals SD and GD are at the logic value 0, the supply signal SP and the control signal GP are pulled down to the negative bias voltage $V_{BB}$, and the control signal SP is pulled up to the positive bias voltage $V_{PP}$.

By using the negative level shifters 305s, 305g the control signals GP and SP, applied to the gate terminals of the transistors P1o, N1o and N2o of the selector 140, assume the value of the positive bias voltage $V_{PP}$ or of the negative bias voltage $V_{BB}$ (according to the selection signals SD, GD). In this way, the negative bias voltage $V_{BB}$, also applied to the source terminals of the transistors N1o and N2o, can assume any value (within the technological limits).

Similar considerations apply if each stage of the level shifters has a different configuration (for example, of a feedback type). Alternatively, the selector is implemented by equivalent electronic switches, and the like.

None of the circuits described above allows the selection of a wordline 110 for an erase operation. During the erase operation of some embodiments it is necessary to apply a very low voltage (typically −9 V) to the selected wordline 110. The selector in the circuit of FIG. 2 cannot correctly work if the negative bias voltage $V_{BB}$ is lower than −1.2 V, as above explained. As far as the circuit of FIG. 3 is concerned, the normal transistors of the selector 140 in many designs does not tolerate a voltage between the drain and the source terminals higher than a typical breakdown voltage (9 V). When the negative bias voltage $V_{BB}$ is equal to the erase voltage (−9 V), it is then necessary to pull down the positive bias voltage $V_{PP}$ to the ground voltage. In this way, however, the drain terminals of the transistors P3s, P4s and P3g, P4g will be floating, thereby impairing operation of the level shifters 205s, 205g. Therefore, all the memory cells 105 of the sector must be erased at the same time if this type of erase technologies is used.

Figure 4:
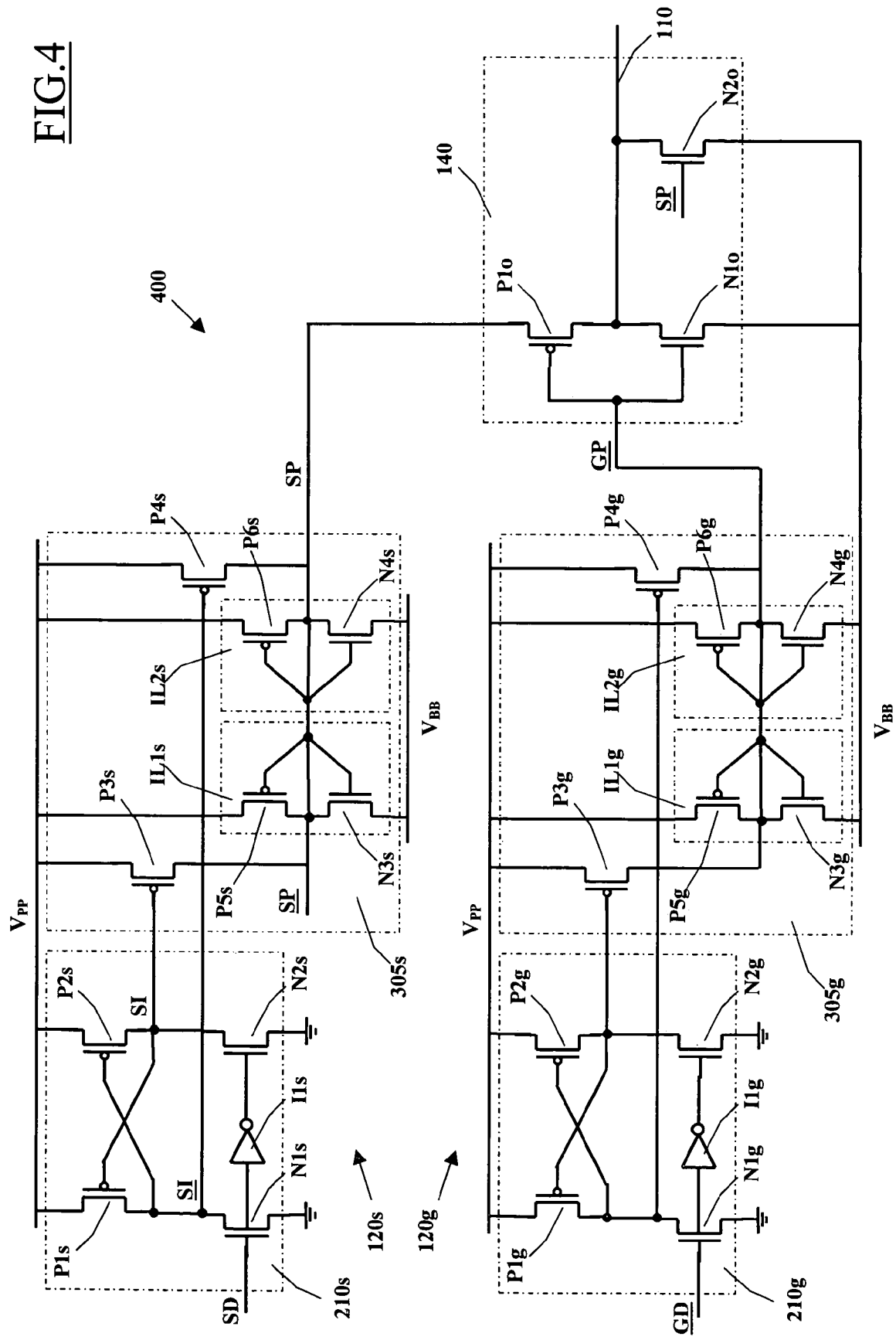
FIG. 4 shows a further embodiment of the invention.

Referring now to FIG. 4, a circuit 400 according to a further embodiment of the present invention that overcomes the above mentioned additional drawback is shown (the elements corresponding to the ones in the FIG. 3 are denoted with the same references and their explanation is omitted for the sake of simplicity). In this case, the second stage 305s of the level shifter 120s is implemented by using two further p-MOS transistors P5s, P6s. The drain terminals of the transistors P5s, N3s and the drain terminals of the transistors P6s, N4s are connected together. The source terminals of the transistors P5s, P6s receive the positive bias voltage $V_{PP}$; the gate terminals of the transistors P5s and P6s are connected to the drain terminals of the transistors N4s and N3s, respectively. In this way, the transistors P5s, N3s and the transistors P6s, N4s implement two cross-coupled inverters IL1s, IL2s (supplied between the bias voltages $V_{PP}$ and $V_{BB}$). The gate terminals of the transistors P5s and N3s, i.e., the input terminal of the inverter IL1s, are connected to the drain terminals of the transistors P6s and N4s, i.e., the output terminal of the inverter IL2s. The drain terminals of the transistors P5s and N3s, i.e., the output terminal of the inverter IL1s, are connected to the gate terminals of the transistors P6s and N4s, i.e., the input terminal of the inverter IL2s. The two cross-coupled inverters IL1s and IL2s implement a latch (supplied between the bias voltages $V_{PP}$ and $V_{BB}$). Likewise, two additional transistors P5g and P6g implement a latch IL1g, IL2g in the second stage 305g of the level shifter 120*g*. The latch IL1*s*, IL2*s* in the level shifter 120*s* latches the supply signal SP (and the control signal SP); likewise, the latch IL1*g*, IL2*g* in the level shifter 120*g* latches the control signal GP.

For erasing the memory cells of a selected wordline 110, the decoder of the wordline address ADR implements a complementary code of addressing. In the complementary code of addressing, the wordline 110 is selected when the selection signals SD, GD are de-asserted; in this way, the positive bias voltage $V_{PP}$ will be applied to the deselected wordlines and the negative bias voltage $V_{BB}$ will be applied to the selected wordline.

Initially, the positive bias voltage $V_{PP}$ is set to a voltage higher than the ground voltage (for example, 2 V) and the negative bias voltage $V_{BB}$ is set to a voltage higher than the erase voltage (for example, −2 V).

The desired wordline 110 can then be selected by using the complementary code of addressing (GD=1, SD=0). In this way, the selected wordline 110 will be at the negative bias voltage $V_{BB}$ (−2 V) and the deselected wordlines will be at the positive bias voltage $V_{PP}$ (2 V), with the corresponding signals SP, SP and GP that are latched by the elements IL1*s*, IL2*s* and IL1*g*, IL2*g*.

Then, for applying the erase voltage to the selected wordline 110 without damaging the transistors of the selector 140, the positive bias voltage $V_{PP}$ is pulled down to the ground voltage and the negative bias voltage $V_{BB}$ is pulled down to the erase voltage (−9 V). In this way, the drain terminals of the transistors P3*s*, P4*s* and P3*g*, P4*g* will be floating. However, the latches IL1*s*, IL2*s* and IL1*g*, IL2*g* (supplied between the bias voltages $V_{PP}$ and $V_{BB}$) are able to bring the signals SP, SP and GP to the desired values.

Alternatively, the latches in the level shifters are implemented by equivalent elements or are placed elsewhere. Similar considerations apply if a subset (consisting of one or more wordlines) is selected during the erase operation, and the like.

More generally, the present invention proposes a driving circuit for a memory line controlling one or more memory cells of a non-volatile memory device. The driving circuit is responsive to a first and a second selection signals; each selection signal is suitable to assume a first logic value or a second logic value. The driving circuit includes a first level shifter (for converting the first selection signal into a first operative signal) and a second level shifter (for converting the second selection signal into a second operative signal); each level shifter is provided with first shifting means for shifting one of the logic values of the corresponding selection signal to a first bias voltage. The circuit further includes a selector for applying the first operative signal or a second bias voltage to the memory line according to the other operative signal. In the circuit of the invention, each level shifter is provided with second shifting means for shifting another of the logic values of the corresponding selection signal to the second bias voltage.

The proposed structure supports a full swing mode of operation; therefore, the circuit is able to apply a voltage assuming any value to the memory line (within the technological limits). For example, the driving circuit of the present invention ensures that the voltage applied to the memory cells of the deselected wordlines is always lower than their threshold voltage; therefore, the corresponding memory cells will be always non-conductive (even if they are depleted). In this way, any leakage current flowing through the bitlines with depleted memory cells is greatly reduced. As a consequence, the reliability of the memory device is substantially increased.

The preferred embodiment of the invention described above offers further advantages.

Particularly, the selector consists of two electronic switches.

This structure is very simple, but at the same time effective.

Preferably, each level shifter is implemented by two cascade connected stages. In this way, the desired result is achieved without introducing any supplementary time delay (with respect to the circuit known in the art).

However, the solution according to the present invention is also suitable to be implemented with different structures of either the level shifters or the selector.

As a further enhancement, each level shifter includes a latch for storing and setting the operative signal according to the selection signal.

This embodiment permits to erase a subset of memory lines at the time.

A suggested choice for implementing each latch is to use two cross-coupled inverters.

In this way, the desired result can be easily obtained adding two transistors only to the second stage of each level shifter.

However, the circuit of the invention is also suitable to be implemented with latches including equivalent elements or having a different structure (for example, a latch based on cross-coupled NOR-gates) or ever without any latch.

The concepts of the present invention are preferably applicable in a flash memory, and particularly when the memory line is a wordline.

However, different applications of the proposed solution are not excluded. For example, the circuit is suitable to be used in an $E^2$PROM, or more generally in any non-volatile memory device; alternatively, the circuit drives a different memory line, such as a bitline or a sourceline.

Naturally, in order to satisfy local and specific requirements, a person skilled in the art may apply to the solution described above many modifications and alterations all of which, however, are included within the scope of protection of the invention as defined by the following claims.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A circuit for driving a memory line controlling at least one memory cell of a non-volatile memory device, the circuit being responsive to a first and a second selection signals each one suitable to assume a first logic value or a second logic value, wherein the circuit comprises:
    a first level shifter for converting the first selection signal into a first operative signal and a second level shifter for converting the second selection signal into a second operative signal, each level shifter including first shifting means for shifting one of the logic values of the corresponding selection signal to a first bias voltage;
    a selector for applying the first operative signal or a second bias voltage to the memory line according to the second operative signal; and
    each level shifter further includes second shifting means for shifting another of the logic values of the corresponding selection signal to the second bias voltage.

2. The circuit according to claim 1 wherein the selector includes a first electronic switch for applying the first operative signal to the memory line and a second electronic switch for applying the second bias voltage to the memory line, the first and the second electronic switches being controlled by the second operative signal.

3. The circuit according to claim 1 wherein each level shifter includes a first stage for converting the selection signal into an intermediate signal through the first shifting means, the first stage having a first leg for providing the intermediate signal and a further first leg for providing a further intermediate signal opposite to the intermediate signal, and a second stage for converting the intermediate signal into the operative signal, the second stage having a second leg for providing the operative signal and a further second leg for providing a further operative signal opposite to the operative signal, and wherein the selector includes a further electronic switch for applying the second bias voltage to the memory line, the further electronic switch being controlled by the further operative signal provided by the first level shifter.

4. The circuit according to claim 1 wherein each level shifter includes latching means for latching the operative signal, the latching means being supplied by the first and the second bias voltages, and means for setting the latching means according to the selection signal, the means for setting being disabled when the first bias voltage is equal to the first logic value or the second logic value.

5. The circuit according to claim 4 wherein the latching means includes a first inverter having a first input terminal and a first output terminal and a second inverter having a second input terminal, connected to the first output terminal, and a second output terminal, connected to the first input terminal, the first output terminal providing the operative signal and the second output terminal providing the further operative signal, and wherein the means for setting includes a first transistor for applying the first bias voltage to the first input terminal in response to the intermediate signal and a second transistor for applying the first bias voltage to the second input terminal in response to the further intermediate signal.

6. The circuit according to claim 1 wherein the memory line is a wordline.

7. A non-volatile memory device, comprising:
a plurality of memory cells;
a plurality of memory lines each one controlling at least one of the memory cells;
means for decoding a memory line address into a plurality of first selection signals and a plurality of second selection signals; and
a plurality of circuits for driving the memory lines, the circuits being responsive to first and a second selection signals each one suitable to assume a first logic value or a second logic value, each circuit including:
a first level shifter to convert the first selection signal into a first operative signal and a second level shifter to convert the second selection signal into a second operative signal, each level shifter including a first shifting element to shift one of the logic values of the corresponding selection signal to a first bias voltage;
a selector to apply the first operative signal or a second bias voltage to a memory line according to the second operative signal; and
each level shifter further including a second shifting element to shift another of the logic values of the corresponding selection signal to the second bias voltage, wherein the selectors are each for a corresponding memory line, the selectors being grouped into a plurality of sets, the first level shifters are each to provide the first operative signal to a corresponding selector in all the sets, and the second level shifters are each to provide the second operative signal to all the selectors in a corresponding set.

8. The memory device according to claim 7 wherein the memory device is of the flash type.

9. A method of driving a memory line controlling at least one memory cell of a non-volatile memory device, the method comprising:
providing a first and a second selection signals, each one suitable to assume a first logic value or a second logic value;
converting the first selection signal into a first operative signal and the second selection signal into a second operative signal by shifting one of the logic values of the corresponding selection signal to a first bias voltage;
applying the first operative signal or a second bias voltage to the memory line according to the second operative signal; and
said converting further includes shifting another of the logic values of the corresponding selection signal to the second bias voltage.

10. A method of erasing a flash memory including a plurality of wordlines each one associated with a first and a second selection signals, each one suitable to assume a first logic value or a second logic value, the method comprising:
selecting at least one wordline by asserting the corresponding first and second selection signals,
converting each first selection signal into a first operative signal and each second selection signal into a second operative signal by shifting one of the logic values of the corresponding selection signal to a first bias voltage and another of the logic values of the corresponding selection signal to a second bias voltage,
latching each operative signal by corresponding latching means, the latching means being supplied by the first and the second bias voltages,
setting the first bias voltage to the first logic value and the second bias voltage to an erase value, and
applying the second bias voltage to each selected wordline and the corresponding first operative signal to each non-selected wordline in response to the corresponding second operative signal.

11. A circuit to drive a memory line that controls at least one memory cell of a non-volatile memory device, the circuit being responsive to first and second selection signals that are suitable to assume a first logic value or a second logic value, the circuit comprising:
a first level shifter to convert the first selection signal into a first operative signal and a second level shifter to convert the second selection signal into a second operative signal, each level shifter including a first shifting element to shift one of the logic values of the corresponding selection signal to a first bias voltage; and
a selector to apply the first operative signal or a second bias voltage to the memory line according to the second operative signal, wherein each level shifter further includes:
a second shifting element to shift another of the logic values of the corresponding selection signal to the second bias voltage;
a latching element to latch the operative signal, the latching element being supplied by the first and the second bias voltages; and a setting element to set the latching element according to the selection signal, the setting element being disabled when the first bias voltage is equal to the first logic value or the second logic value.

12. The circuit of claim 11 wherein the memory device is a flash type memory device.

13. A circuit to drive a memory line that controls at least one memory cell of a non-volatile memory device, the circuit being responsive to first and second selection signals that are suitable to assume a first logic value or a second logic value, the circuit comprising:
  a first level shifter to convert the first selection signal into a first operative signal and a second level shifter to convert the second selection signal into a second operative signal, each level shifter including a first shifting element to shift one of the logic values of the corresponding selection signal to a first bias voltage; and
  a selector to apply the first operative signal or a second bias voltage to the memory line according to the second operative signal, wherein each level shifter further includes:
    a second shifting element to shift another of the logic values of the corresponding selection signal to the second bias voltage;
    a first stage to convert the selection signal into an intermediate signal through the first shifting element, the first stage having a first leg to provide the intermediate signal and a further first leg to provide a further intermediate signal opposite to the intermediate signal; and
    a second stage to convert the intermediate signal into the operative signal, the second stage having a second leg to provide the operative signal and a further second leg to provide a further operative signal opposite to the operative signal, and wherein the selector includes a further electronic switch to apply the second bias voltage to the memory line, the further electronic switch being controllable by the further operative signal provided by the first level shifter.

14. The circuit of claim 13 wherein the memory device is a flash type memory device.

* * * * *